United States Patent
Minowa et al.

(10) Patent No.: US 8,817,151 B2
(45) Date of Patent: Aug. 26, 2014

(54) SOLID-STATE IMAGING DEVICE AND METHOD FOR SOLID-STATE IMAGING DEVICE FOR TRANSFERRING CHARGE FROM A PHOTOELECTRIC CONVERSION PORTION TO A FLOATING DIFFUSION

(75) Inventors: Masaaki Minowa, Kawasaki (JP); Akira Okita, Yamato (JP)

(73) Assignee: Canon Kabushiki Kaisha, Tokyo (JP)

( * ) Notice: Subject to any disclaimer, the term of this patent is extended or adjusted under 35 U.S.C. 154(b) by 519 days.

(21) Appl. No.: 13/158,266

(22) Filed: Jun. 10, 2011

(65) Prior Publication Data

US 2011/0316839 A1 Dec. 29, 2011

(30) Foreign Application Priority Data

Jun. 24, 2010 (JP) ................. 2010-144221

(51) Int. Cl.
| | | |
|---|---|---|
| *H04N 3/14* | (2006.01) | |
| *H04N 5/3745* | (2011.01) | |
| *H01L 27/146* | (2006.01) | |
| *H04N 5/355* | (2011.01) | |
| *H04N 5/359* | (2011.01) | |

(52) U.S. Cl.
CPC ........ *H01L 27/14609* (2013.01); *H04N 5/3745* (2013.01); *H01L 27/14643* (2013.01); *H01L 27/14612* (2013.01); *H04N 5/3559* (2013.01); *H04N 5/3597* (2013.01); *H04N 5/355* (2013.01)
USPC .......................................................... 348/308

(58) Field of Classification Search
CPC ... H04L 31/072; H04L 27/148; H04L 29/768; H04L 29/765; H04L 29/762
See application file for complete search history.

(56) References Cited

U.S. PATENT DOCUMENTS

| | | | | |
|---|---|---|---|---|
| 6,744,084 | B2 * | 6/2004 | Fossum | 257/292 |
| 6,903,394 | B2 * | 6/2005 | Agarwal | 257/292 |
| 7,176,462 | B2 * | 2/2007 | Mabuchi | 250/340 |
| 7,525,134 | B2 * | 4/2009 | Rhodes et al. | 257/222 |
| 2005/0121519 | A1 | 6/2005 | Shinohara | |
| 2006/0138489 | A1 | 6/2006 | Ahn et al. | |
| 2006/0157761 | A1 | 7/2006 | Park et al. | |
| 2006/0261431 | A1 | 11/2006 | Kim et al. | |
| 2007/0252182 | A1 | 11/2007 | Beck | |
| 2008/0012973 | A1 | 1/2008 | Park et al. | |
| 2009/0322921 | A1 | 12/2009 | Ishimoto et al. | |

FOREIGN PATENT DOCUMENTS

| | | |
|---|---|---|
| CN | 1833429 A | 9/2006 |
| CN | 101106658 A | 1/2008 |
| CN | 101616276 A | 12/2009 |
| EP | 1017107 A2 | 7/2000 |
| JP | 09-046596 A | 2/1997 |
| JP | 2005-192191 A | 7/2005 |
| JP | 2005-268295 A | 9/2005 |
| JP | 2006-120679 A | 5/2006 |
| JP | 2010-109677 A | 5/2010 |
| KR | 10-2006-0024796 A | 3/2006 |
| WO | 2004/112376 A1 | 12/2004 |

\* cited by examiner

*Primary Examiner* — Gary C Vieaux
(74) *Attorney, Agent, or Firm* — Canon USA, Inc. IP Division

(57) ABSTRACT

An amplification-type solid-state imaging device supplies a voltage of VRESL1 to a gate of a reset transistor when a signal of a vertical output line is read out and supplies a voltage of VRESL2, which is greater than VRESL1, when the signal charge accumulated in a photodiode is transferred to an FD so that, via a capacitor provided between the gate of the reset transistor and the FD, good linearity is obtained by decreasing the voltage of the FD when the signal is read out and the maximum amount of charge which can be transferred is increased by increasing the voltage of the FD when the charge is transferred.

29 Claims, 10 Drawing Sheets

SOLID-STATE IMAGING DEVICE AND METHOD FOR SOLID-STATE IMAGING DEVICE FOR TRANSFERRING CHARGE FROM A PHOTOELECTRIC CONVERSION PORTION TO A FLOATING DIFFUSION

BACKGROUND OF THE INVENTION

1. Field of the Invention

The present invention relates to a solid-state imaging device.

2. Description of the Related Art

An amplification type solid-state imaging device being one type of solid-state imaging device transfers a charge generated at a photoelectric conversion portion of each pixel to an input node of an amplifying transistor via a transfer portion.

When the charge is transferred, noise can be reduced if the charge of the photoelectric conversion portion is completely transferred. Japanese Patent Application Laid-Open No. 2005-192191 discusses a method useful for increasing the maximum amount of charge that can be transferred from the photoelectric conversion portion.

According to the solid-state imaging device discussed in Japanese Patent Application Laid-Open No. 2005-192191, before starting the transfer of charge from a photodiode to a floating diffusion (FD), the voltage of the FD is set at a higher value than the voltage of the FD when it is reset. However, the control of the voltage of the FD when a signal is output from an amplifying transistor after the charge has been transferred is not discussed.

According to an amplification type solid-state imaging device, it is desirable to operate the amplifier circuit within an operation range where the linearity of the output signal is good. According to the solid-state imaging device discussed in Japanese Patent Application Laid-Open No. 2005-192191, if the voltage of the FD is high, in some cases, the amplifying transistor operates in a linear region, or the amplifying transistor operates in a boundary region of a saturation region and the linear region. In order to maintain the linearity of the output signal, it is desirable to operate the amplifying transistor in the saturation region. Thus, the solid-state imaging device discussed in Japanese Patent Application Laid-Open No. 2005-192191 has room for improvement from the viewpoint of linearity of the signal output from the amplifying transistor.

SUMMARY OF THE INVENTION

The present invention is directed to a solid-state imaging device that realizes good linearity of an output signal while improving efficiency of charge transfer from a photoelectric conversion portion to a floating diffusion.

According to an aspect of the present invention, a solid-state imaging device includes a first photoelectric conversion portion, a floating diffusion, a first transfer transistor configured to transfer an electron generated at the first photoelectric conversion portion to the floating diffusion, an amplifying transistor configured to output a signal based on an amount of charge of the floating diffusion, a voltage-controlled node, and a voltage control portion configured to control a voltage of the voltage-controlled node. The amplifying transistor outputs a first signal in a first state where a voltage of the floating diffusion is reset, and the amplifying transistor outputs a second signal in a second state where the electron is transferred to the floating diffusion, and the voltage-controlled node is a node different from a node to which a voltage used for controlling a conductive state of the first transfer transistor is supplied, and is coupled to the floating diffusion via a coupling capacitance. The voltage control portion controls the voltage of the voltage-controlled node so that the voltage of the voltage-controlled node is a first voltage when the amplifying transistor outputs the first signal, a second voltage during at least a portion of a period in which the first transfer transistor is in the conductive state, and a third voltage when the amplifying transistor outputs the second signal, and the second voltage is a voltage higher than each of the first voltage and the third voltage.

According to an exemplary embodiment of the present invention, linearity can be improved and thus a solid-state imaging device that realizes an improved image quality can be provided.

Further features and aspects of the present invention will become apparent from the following detailed description of exemplary embodiments with reference to the attached drawings.

BRIEF DESCRIPTION OF THE DRAWINGS

The accompanying drawings, which are incorporated in and constitute a part of the specification, illustrate exemplary embodiments, features, and aspects of the invention and, together with the description, serve to explain the principles of the invention.

DESCRIPTION OF THE EMBODIMENTS

Various exemplary embodiments, features, and aspects of the invention will be described in detail below with reference to the drawings.

Figure 1:
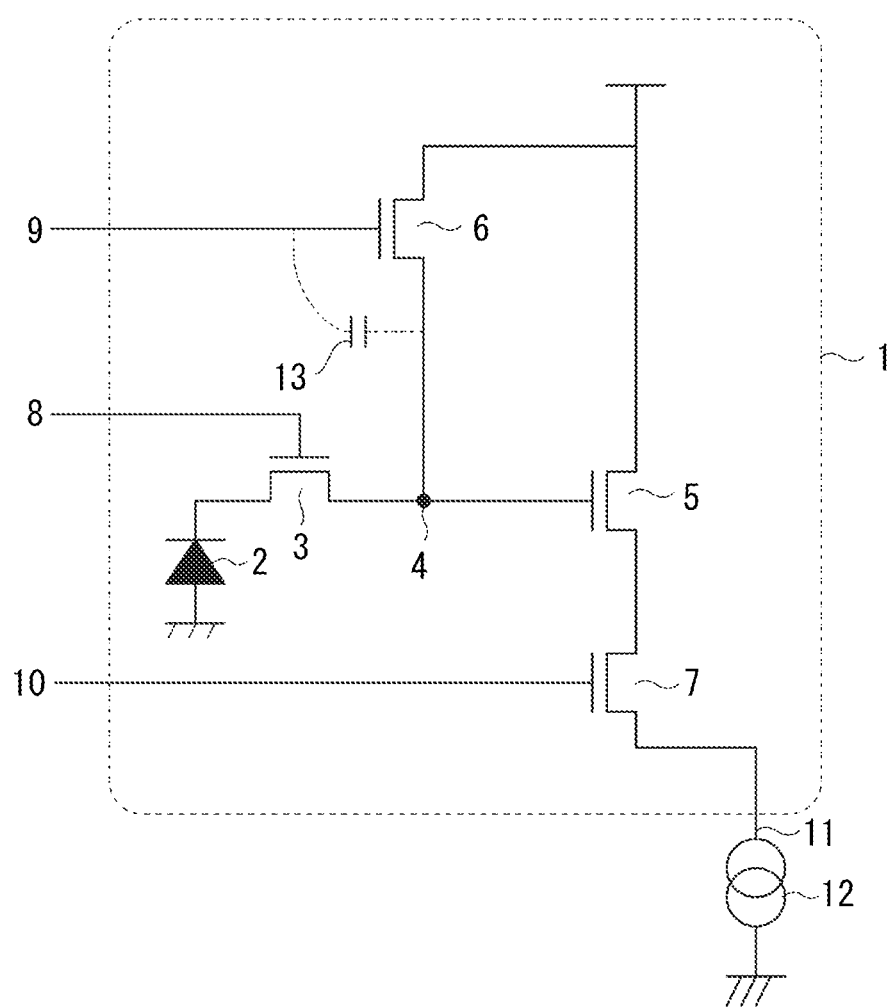
FIG. 1 is an equivalent circuit diagram of a pixel according to a first exemplary embodiment of the present invention.

FIG. 1 illustrates an equivalent circuit of a pixel according to a first exemplary embodiment of the present invention. According to the first exemplary embodiment, an electron carries signal charge.

In FIG. 1, a pixel 1 includes a photodiode (PD) 2 being a photoelectric conversion portion, a transfer transistor 3, an FD 4, an amplifying transistor 5, a reset transistor 6, and a select transistor 7. Incident light is photoelectrically converted by the PD 2. According to the present embodiment, an electron is treated as the signal charge regarding the electron-hole pair generation at the PD 2. The transfer transistor 3 transfers the signal charge from the PD 2 to the FD 4. The FD 4 is connected to a gate of the amplifying transistor 5.

The amplifying transistor 5 outputs a signal based on the amount of charge of the FD 4. According to the present embodiment, the amplifying transistor 5 is an n-channel metal oxide semiconductor (MOS) transistor of a buried channel type. The reset transistor 6 supplies a voltage based on a reset power to the FD 4 and resets the voltage of the FD 4. By the select transistor 7, a pixel row which is to be read out is selected from a plurality of pixel rows.

Control lines 8, 9, and 10 are connected to the gates of the transfer transistor 3, the reset transistor 6, and the select transistor 7, respectively. The gates of the transistors are not electrically short-circuited to each other. Although a coupling capacitance can be provided between each of the gates, the conductive state of each transistor needs to be independently controlled. An amplified signal output from the amplifying transistor 5 is output to a vertical output line 11. A constant current source 12 is connected to the vertical output line 11. A source follower circuit is configured by the amplifying transistor 5 and the constant current source 12.

A capacitor 13, which is provided between a gate of the reset transistor 6 and the FD 4, is a coupling capacitance between the gate and a source of the reset transistor 6. Since the capacitor 13 is provided, the voltage of the FD 4 can be changed according to the voltage supplied to the gate of the reset transistor 6.

Although details are described below, according to the present embodiment, the voltage of the FD 4 can be controlled by control of a voltage of the control line 9 connected to the gate of the reset transistor 6. To be more specific, the voltage of the control line 9 when an electron is transferred from the PD 2 to the FD 4 is controlled so that it is higher than the voltage of the control line 9 when the amplifying transistor outputs a signal.

Figure 2:
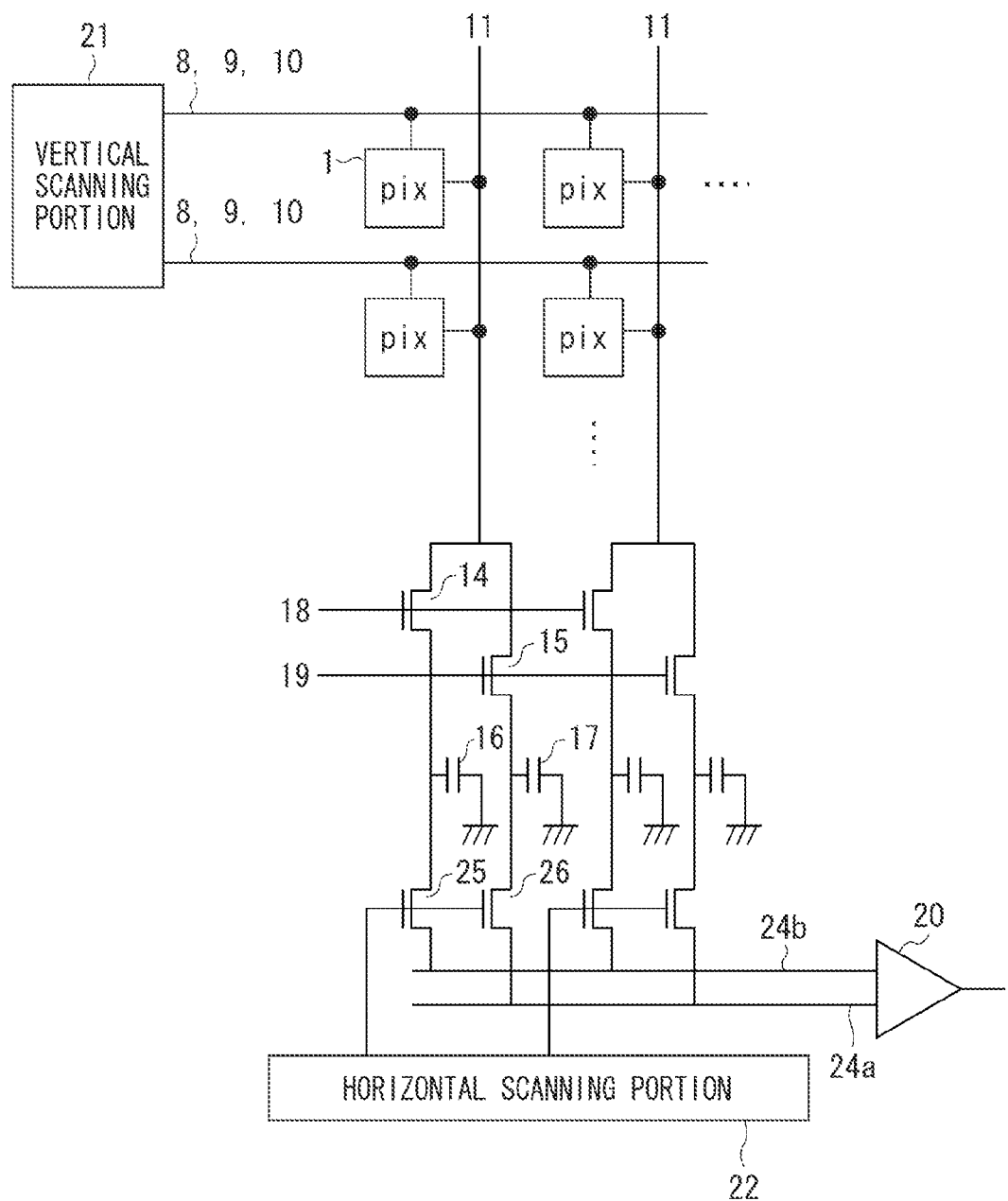
FIG. 2 is a circuit diagram of a pixel region and a signal storage portion according to the first exemplary embodiment.

FIG. 2 is a circuit diagram of a pixel region and a signal storage portion according to the present embodiment. The pixel region is configured by a matrix of a plurality of pixels 1 illustrated in FIG. 1. The control lines 8, 9, and are commonly connected to a plurality of pixels included in one row of pixels. A vertical scanning portion 21 supplies a predetermined voltage to each of the control lines 8, 9, and 10. Further, the vertical scanning portion 21 controls a conductive state of a corresponding transistor. Since a short circuit is not established between the gates of the transistors of the pixels, the conductive state of each transistor can be independently controlled. The vertical scanning portion 21 configures a portion of a voltage control portion described below.

The vertical output line 11 is commonly connected to output nodes of a plurality of pixels included in one column of pixels. As illustrated in FIG. 1, the output node of a pixel is, for example, a source of the select transistor 7. In another case, the output node is a source of the amplifying transistor. Each of the signals output from the plurality of the vertical output lines 11 is supplied to the signal storage portion at approximately the same timing and stored at the signal storage portion.

According to the present embodiment, the signal storage portion is provided for each pixel column. The signal storage portion according to the present embodiment includes two switches 14 and 15 as well as two sample-and-hold capacitors 16 and 17. The switches 14 and 15 control the electric connection between the vertical output line 11 and the sample-and-hold capacitors 16 and 17. Control lines 18 and 19 are connected to each of the gates of the switches 14 and 15.

Further, drive pulses used for controlling a conductive state of the corresponding switch are supplied to the control lines 18 and 19.

The sample-and-hold capacitor 17 holds a signal (hereinafter referred to as an N signal) output from the amplifying transistor 5 when the voltage of the FD 4 is reset. According to the present embodiment, the FD 4 is in a voltage-reset state from when the reset transistor 6 supplies a voltage based on the reset power to the FD 4 to when the signal charge is transferred to the FD 4. At least at some timing during this period, sampling of the N signal can be performed at the sample-and-hold capacitor 17. A reset noise, which is generated when the reset transistor 6 is turned off, can be included in the N signal.

The sample-and-hold capacitor 16 holds a signal (hereinafter referred to as an S signal) output from the amplifying transistor 5 when the signal charge is transferred to the FD 4. According to the present embodiment, the FD 4 is in a charge-transferred state from when the signal charge is transferred to the FD 4 to when a voltage based on the reset power supply is supplied to the FD 4. At least at some timing during this period, sampling of the S signal can be performed.

Switches 25 and 26 control connection of the sample-and-hold capacitors 16 and 17 and horizontal output lines 24a and 24b. A drive pulse used for controlling a conductive state of the switches 25 and 26 is supplied to the corresponding switch from a horizontal scanning portion 22. By the horizontal scanning portion 22, the S signal held by the sample-and-hold capacitor 16 and the N signal held by the sample-and-hold capacitor 17 are sequentially input for each column in a differential amplifier 20.

The differential amplifier 20 amplifies a difference between the S and N signals and outputs the obtained result. Fixed pattern noise due to variation in the threshold value of the amplifying transistor 5 is removed by calculation processing of the difference between the S and N signals. If the S and N signals include a reset noise related to each other, the reset noise which has been generated when the FD 4 has been reset can be removed.

Figure 3:
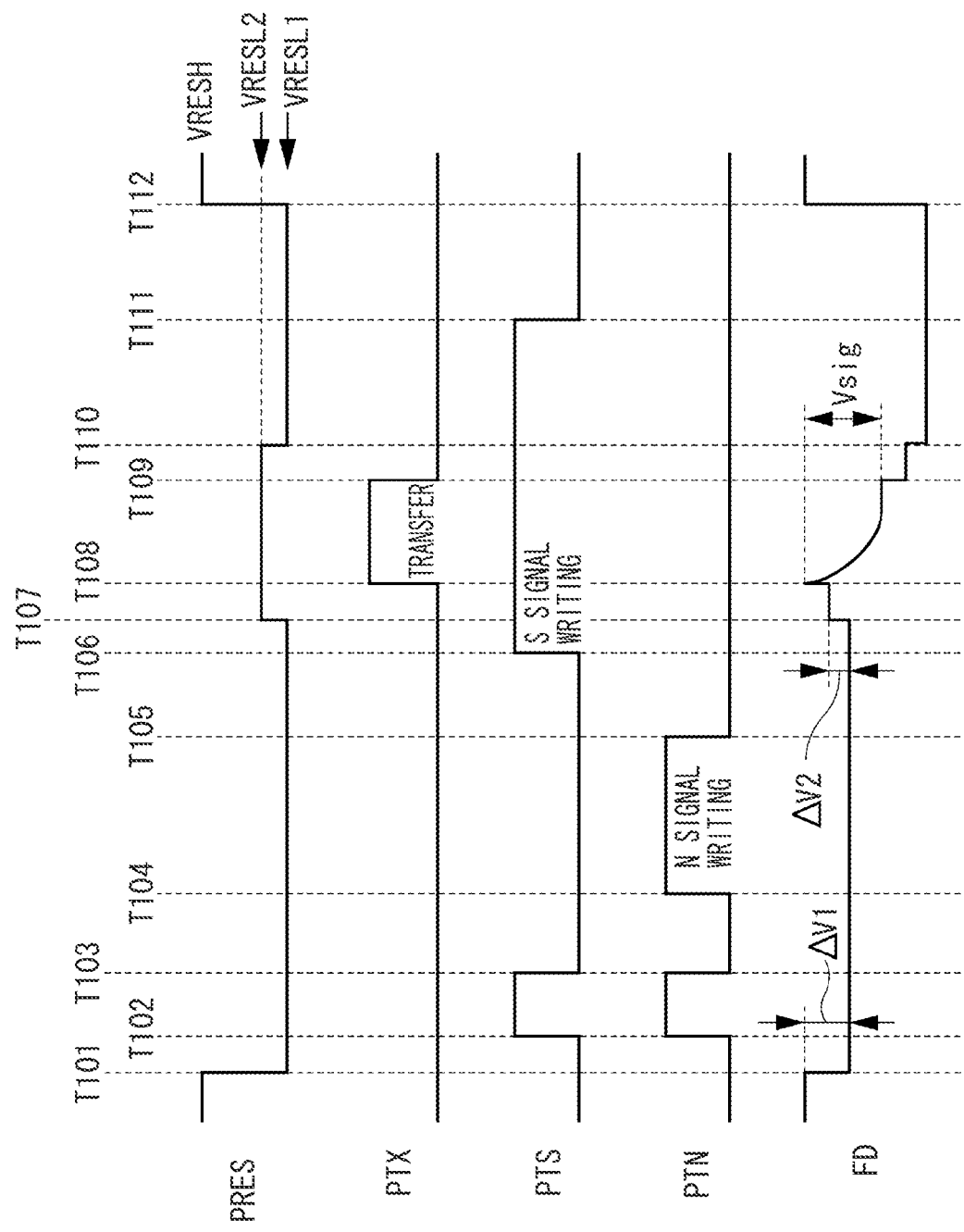
FIG. 3 illustrates drive pulses for driving a solid-state imaging device according to the first exemplary embodiment.

FIG. 3 illustrates drive pulses used for driving the solid-state imaging device according to the present embodiment. Further, FIG. 3 schematically illustrates the change in the voltage of the FD 4 according to the operation of the solid-state imaging device of the present embodiment.

In FIG. 3, PRES denotes a drive pulse supplied to the gate of the reset transistor 6 via the control line 9. PTX denotes a drive pulse supplied to the gate of the transfer transistor 3 via the control line 8. PTS denotes a drive pulse supplied to the switch 14 via the control line 18. PTN denotes a drive pulse supplied to the switch 15 via the control line 19. When the voltage of the drive pulse is at the high level, the corresponding transistor and the switch are turned on. When the voltage of the drive pulse is at the low level, the corresponding transistor is turned off.

Further, according to the present embodiment, two different voltages VRESL1 and VRESL2 can be set as low-level voltages of PRES supplied from the control line 9. Although both VRESL1 and VRESL2 are voltages by which the reset transistor 6 is turned off, VRESL2 is higher than VRESL1. In other words, the reset transistor 6 is turned on when the voltage supplied to PRES is the high-level voltage VRESH and turned off when the voltage supplied to PRES is the low-level voltage VRESL1 or VRESL2 (VRESL2>VRESL1).

Next, a drive method of the solid-state imaging device according to the present embodiment will be described with reference to FIG. 3. In FIG. 3, exposure has already been started and the PD 2 has the signal charge. Further, the select transistor 7 of the pixel row to be read out is turned on.

At first, PTX, PTS, and PTN are at the low level and the transfer transistor 3 and the switches 14 and 15 are turned off. Since PRES is at the high level and the reset transistor 6 is turned on, the voltage of the FD 4 is reset. At this state, reset voltage Vrs of the FD 4 is obtained by the following equation (1) using voltage VRESH supplied to the gate of the reset transistor 6 and threshold voltage Vth_res of the reset transistor 6. The voltage of the reset power is higher than VRESH−Vth_res.

$$Vrs = VRESH - Vth\_res \qquad (1)$$

At time T101, PRES is changed from VRESH to VRESL1. According to this change in the voltage of the gate of the reset transistor 6, the voltage of the FD 4 is decreased by ΔV1 via the capacitor 13. After the reset transistor 6 is turned off at time T101, the N signal, which is the signal output when the voltage of the FD 4 is reset, is output to the vertical output line 11. A reset noise such as kTC noise, which is generated when the reset transistor 6 is turned off, is included in the N signal.

Next, at time T102, PTS and PTN are changed to the high level, the switches 14 and 15 are turned on, and the vertical output line 11 and the sample-and-hold capacitors 16 and 17 are conducted. Accordingly, the sample-and-hold capacitors 16 and 17 are reset by the N signal output to the vertical output line 11. At time T103, PTS and PTN are changed to the low level and the vertical output line 11 and the sample-and-hold capacitors 16 and 17 are non-conducted.

At time T104, PTN is changed to the high level. Then, the switch 15 is turned on and writing of the N signal in the sample-and-hold capacitor 17 is started. At time T105, PTN is changed to the low level, the switch 15 is turned off, and the writing of the N signal in the sample-and-hold capacitor 17 ends. As illustrated in FIG. 3, it is desirable to be able to control the voltage of the gate of the reset transistor 6 at VRESL1 and to have the period (T104 to T105), during which PTN is at the high level, long enough so that it is sufficient for the stabilization of the voltage change of the FD.

Next, at time T106, PTS is changed to the high level, the switch 14 is turned on, and the writing of the S signal to the sample-and-hold capacitor 16 is started.

At time T107, the voltage of PRES is changed from VRESL1 to VRESL2. According to this change in voltage, the voltage of the FD 4 is increased by ΔV2 via the capacitor 13. Even if the voltage of PRES is increased to VRESL2, the reset transistor 6 is not turned on.

At time T108, PTX is changed to the high level and the transfer transistor 3 is turned on. At this point in time, the transfer of the signal charge of the PD 2 to the FD 4 is started. At time T109, PTX is changed to the low level, the transfer transistor 3 is turned off, and the transfer of the signal charge ends. It is desirable to be able to have the time between T108 and T109 long enough so that all the signal charge accumulated in the PD 2 can be transferred.

If all the signal charge is transferred, in other words, if the signal charge is completely transferred, the transfer of the signal charge can be completed before time T109. Further, according to the amount of signal charge transferred to the FD 4, the voltage of the FD 4 is decreased by a voltage Vsig. After the signal charge is transferred to the FD 4, the S signal, which is a signal output in the state the signal charge is transferred to the FD 4, is output to the vertical output line 11.

At time T110, when the voltage of PRES is changed from VRESL2 to VRESL1, the voltage of the FD 4 is decreased by ΔV2.

Next, at time T111, PTS is changed to the low level. Then, the switch 14 is turned off and the writing of the S signal to the sample-and-hold capacitor 16 ends. It is desirable to be able to control the voltage of the gate of the reset transistor 6 at VRESL1 and to have the period (T110 to T111), during which PTS is at the high level, long enough so that it is sufficient for the stabilization of the voltage change of the FD. At time T112, PRES is changed to VRESH and the voltage of the FD 4 is reset.

There are two important points regarding the present embodiment. The first point is that the voltage supplied to the gate of the reset transistor 6 is controlled at VRESL1 at time T105 and time T111. The second point is that the voltage supplied to the gate of the reset transistor 6 from time T107 to T110 is controlled at VRESL2 being a voltage higher than VRESL1.

According to the second point, the signal charge can be transferred to the FD 4 at a voltage ΔV2 higher than when VRESL1 is output. The voltage of the PD 2 is decreased from the voltage at the time it is reset before the photoelectric conversion according to the amount of signal charge generated by the photoelectric conversion. In such a state, since the voltage of the FD 4 is increased by ΔV2, the voltage difference between the PD 2 and the FD 4 can be increased. Accordingly, the maximum amount of charge that can be transferred from the PD 2 to the FD 4 can be increased and the complete transfer of the signal charge can be performed more easily.

Further, according to the first point, since the voltage of the FD 4 is decreased, the amplifying transistor 5 can operate more easily in the saturation region. Thus, the linearity of the signal output from the amplifying transistor can be improved.

According to the operation illustrated in FIG. 3, while the transfer transistor 3 is turned on, the voltage of the gate of the reset transistor 6 is continuously maintained at a voltage higher than the voltage output by the amplifying transistor. However, the operation can be performed so long as the period during which the voltage supplied to the gate of the reset transistor 6 is controlled at VRESL2 overlaps a portion of a period during which the transfer transistor 3 is turned on.

Figure 4:
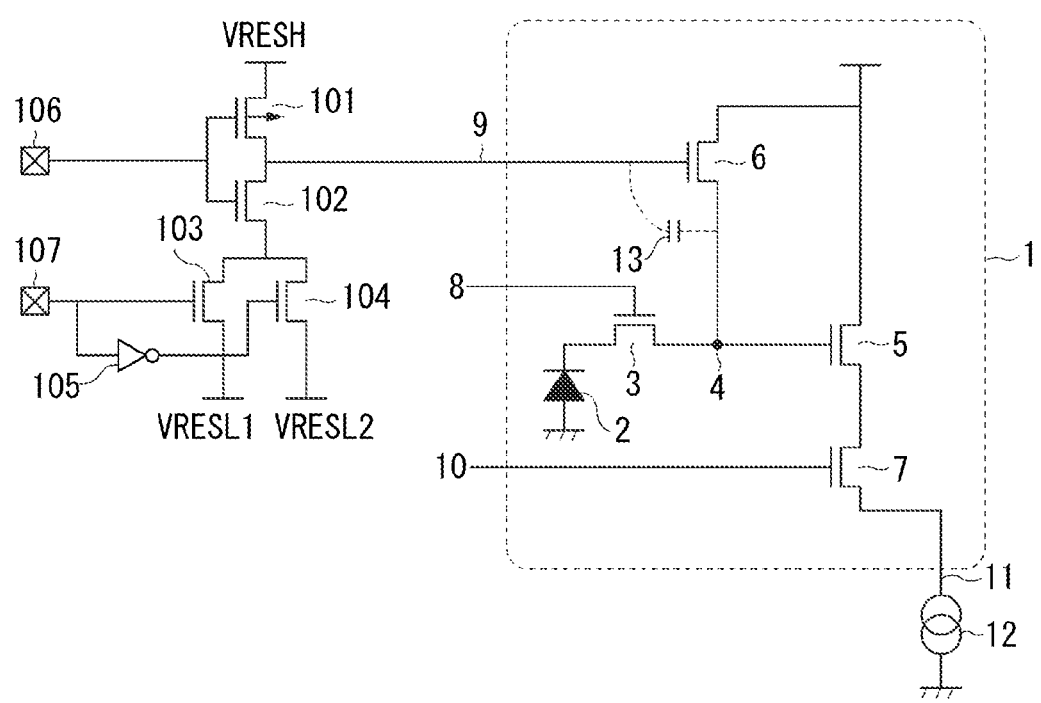
FIG. 4 illustrates a circuit that realizes the equivalent circuit of a pixel and the drive pulses illustrated in FIG. 3 according to the first exemplary embodiment.

FIG. 4 illustrates an example of a circuit used for supplying the three values VRESH, VRESL1, and VRESL2 to the control line 9. A p-channel MOS (PMOS) transistor 101 is turned on when a low-level voltage is supplied to the gate and turned off when a high-level voltage is supplied. N-channel MOS (NMOS) transistors 102, 103, and 104 are turned on when a high-level voltage is supplied to each of the gates and turned off when a low-level voltage is supplied to each of the gates. The circuit also includes an inverter 105.

If the voltage of a first node 106 is set to the low level, VRESH is output to the control line 9 regardless of the voltage of a second node 107. If both the voltages of the first node 106 and the second node 107 are set to the high level, VRESL1 is output to the control line 9. If the voltage of the first node 106 is set to the high level and the voltage of the second node 107 is set to the low level, VRESL2 is output to the control line 9.

The transistors 101 to 104 and the inverter 105 are arranged at a stage subsequent to the vertical scanning portion 21 illustrated in FIG. 2 or integrated into the vertical scanning portion 21. A pulse from the vertical scanning portion 21 is supplied to at least either of the first node 106 and the second node 107. In other words, a pulse from the vertical scanning portion 21 can be supplied to both the first node 106 and the second node 107 but can be supplied to one of the nodes. When the pulse is supplied to only one of the nodes, a pulse can be supplied to the other node directly from the outside of the chip or from outside of the chip via a simple logic circuit.

Thus, since voltages of three values can be supplied to the control line 9 by at least the vertical scanning portion 21, the transistors 101 to 104, and the inverter 105, these components function as the voltage control portion of the node that is connected to the FD via the coupling capacitance. Further, a timing generator can be included in the voltage control portion.

Next, the effect obtained by the present embodiment will be described in detail. First, conditions required in performing the complete transfer of the signal charge of the photoelectric conversion portion and conditions required in favorably maintaining the linearity of the sensor output will be described.

In the following description, the maximum amount of charge that can be accumulated in the PD 2 is called as an amount of saturated charge. If an amount of saturated signal charge is accumulated in the PD 2, the condition necessary in performing the complete transfer of the signal charge is expressed by the following equation (2).

$$Vrs - Vsat > Vdep \quad (2)$$

Vsat is the amount of voltage change of the FD 4 when the amount of saturated signal charge of the PD 2 is transferred to the FD 4 and Vdep is the voltage of the FD 4 necessary in performing full depletion of the PD 2.

Out of the semiconductor regions that configure the PD 2, the region which is completely depleted is at least the n-type semiconductor region. Vdep is a voltage that can completely deplete the n-type semiconductor region that configures the PD 2. As can be seen from equation (2), with respect to the complete transfer of the signal charge, higher reset voltage Vrs of the FD 4 is desirable.

In order to obtain good linearity based on good relation between the amount of incident light and the output signal of the amplifying transistor, the amplifying transistor 5 needs to satisfy the following equation (3) being a condition for the source follower operation (condition for operation in the saturation region).

$$Vg - Vd < Vth\_sf \quad (3)$$

Vg, Vd, and Vth_sf are the gate voltage, the drain voltage, and the threshold voltage of the amplifying transistor 5, respectively.

As illustrated in FIG. 1, since the gate of the amplifying transistor 5 is connected to the FD 4, Vg is the voltage of the FD 4. Similarly, since the drain of the amplifying transistor 5 is connected to the power supply, Vd is the power supply voltage. Since the voltage of the FD 4 is decreased when the signal charge is transferred to the FD 4, if equation (3) is satisfied when Vg is Vrs being the reset voltage of the FD 4, good linearity can be maintained over a wide luminance region. Thus, the condition for good linearity in a wide luminance region can be expressed by the following equation (4).

$$Vrs - Vd < Vth\_sf \quad (4)$$

As equation (4) shows, in order to improve linearity, a lower voltage of the FD 4 is desirable. In other words, a lower reset voltage of the FD 4 is desirable. However, if the reset voltage Vrs is decreased in order to satisfy equation (4), it becomes difficult to satisfy equation (2) being the condition for the complete transfer.

A method for increasing the voltage of the FD 4 for the complete transfer of the signal charge is discussed in Japanese Patent Application Laid-Open No. 2005-192191. However, if a signal is output from the amplifying transistor 5 in a state the voltage of the FD 4 is high, since it is difficult to satisfy equation (3), it becomes difficult to obtain the linearity.

As described above, there is a trade-off between the complete transfer of the signal charge or the charge transfer with high efficiency and linearity of the output signals from the amplifying transistor. Thus, the time the equation (2) being the condition for realizing the complete transfer of the signal charge and the equation (4) being the condition for realizing good linearity need to be satisfied has been focused.

The equation (2) needs to be satisfied only when the charge is transferred (from time T108 to T109 in FIG. 3), and it is not necessarily satisfied when the charge transfer is not performed. On the other hand, the equation (4) needs to be satisfied only at time T111 and T105 when the S signal and the N signal are written in the corresponding sample-and-hold capacitors 16 and 17, and it is not necessarily satisfied in other periods. Thus, in order to satisfy the two conditions, the voltage of the FD 4 is controlled at a low level at time T111 and T105 and controlled at a high level at least a portion of the time between T108 and T109.

According to the present embodiment, VRESL1 is supplied to the gate of the reset transistor 6 at time T105 and T111, and VRESL2 is supplied to the gate of the reset transistor 6 between time T107 and T110. The voltage of the FD 4 at time T107 is expressed as Vrs−ΔV1+ΔV2. The voltage of the FD 4 at time T105 is expressed as Vrs−ΔV1. Thus, the condition for the complete transfer of the signal charge and the condition for obtaining good linearity can be expressed by the following equations (5) and (6) by using equation (1).

$$VRESH - Vth\_res - \Delta V1 + \Delta V2 - Vsat > Vdep \quad (5)$$

$$VRESH - Vth\_res - \Delta V1 - Vd < Vth\_sf \quad (6)$$

The voltage of the FD 4 at time T111 is expressed as Vrs−ΔV1−Vsig. Vsig is the amount of voltage change of the FD 4 due to the transfer of the signal charge. If the signal charge is an electron, since the voltage of the FD 4 is decreased according to the transfer of the signal charge, good linearity can be obtained if equation (6) is satisfied.

For example, by fixing VRESH, and setting VRESL2 which provides ΔV2 that satisfies equation (5) after setting VRESL1 which provides ΔV1 that satisfies equation (6), both the equations (5) and (6) can be satisfied. Thus, according to the present embodiment, even if the voltage of the FD 4 is increased when the signal charge is transferred so that the maximum amount of charge that can be transferred is increased, good linearity of the sensor output can be obtained. Although it is desirable to completely satisfy equations (5) and (6), by controlling the voltage of the FD 4 at a low level at time T111 and T105 and by controlling the voltage of the FD 4 at a high level at least a portion of time between T108 and T109, a certain effect can be obtained even if equations (5) and (6) are not completely satisfied.

Further, by using a buried channel-type transistor as the amplifying transistor 5, a noise such as random telegraph signal (RTS) noise can be reduced. The deeper the channel is buried in the channel portion from the interface of the gate insulator and the channel portion, the more the effect of the noise reduction is obtained. However, if the buried channel type transistor is used as the amplifying transistor 5, Vth_sf will be decreased. Since Vth_sf is decreased as the channel is buried deeper in the channel portion, it becomes difficult to satisfy equation (4). Thus, when the configuration of the present embodiment is applied to a buried channel-type transistor used as the amplifying transistor, the effect of the improvement regarding the linearity can be recognized more clearly.

Each of equations (2) and (4) can be modified as the following equations (7) and (8). If the threshold voltage of the amplifying transistor 5 is low, especially when it goes negative, Vsat+Vdep can be smaller than Vd+Vth_sf. A reset voltage Vrs that satisfies both equations (7) and (8) at the same time does not exist. If the present invention is implemented in such a case, the effect of the improvement regarding linearity in the low luminance region can be recognized more clearly.

$$Vsat+Vdep<Vrs \quad (7)$$

$$Vrs<Vd+Vth\_sf \quad (8)$$

Further, as a method for solving the issue of the complete transfer, a method that increases the voltage of the FD when the charge is transferred is discussed in Japanese Patent Application Laid-Open No. 2005-192191. This method uses a coupling capacitance provided between a signal output line of an amplified signal output from an amplifying transistor and an FD. This coupling capacitance can be a capacitor that is intentionally integrated but can also be a parasitic capacitance.

If the coupling capacitance is a parasitic capacitance, since variation due to manufacture process will be significant, accuracy in the voltage control also varies. The capacitance of the FD is composed of a number of components such as a p-n junction capacitance, a capacitance provided between a line (wiring) from the FD to the gate of the amplifying transistor and another line or a silicon substrate, and a gate capacitance of the amplifying transistor.

Among these capacitances, the capacitance provided between the line from the FD to the gate of the amplifying transistor and the between the line of an upper layer tends to vary according to the variation in thickness of the interlayer dielectric film. The variation is especially noticeable when the general multilayer interconnection technique that uses chemical mechanical planarization (CMP) in the planarization process is used.

According to the present embodiment, the source of the reset transistor 6 is connected to the FD 4 and the voltage of the FD 4 is controlled by the coupling capacitance provided between the gate and the source of the reset transistor 6. The coupling capacitance between the gate and the source of the reset transistor 6 is the main component of the capacitor 13.

Since the variation in manufacture due to the gate electrode forming process of the MOS transistor is smaller than the variation in manufacture due to the CMP process, according to the configuration described above, the voltage of the FD 4 can be controlled with accuracy. According to a configuration that controls a gate voltage of a MOS transistor whose source or drain is connected to an FD, linearity of the sensor output can be improved by using a method having smaller impact due to manufacture process on variation.

Further, the present embodiment can be realized by intentionally providing a capacitance for the FD 4. However, in this case, the layout area of the pixel portion will be affected. According to the present embodiment, since the voltage of the FD 4 is controlled by using the coupling capacitance provided between the gate and the source of the reset transistor 6, it will not affect the layout of the pixel portion.

The advantage of small variation due to the manufacture process is obtained when a coupling capacitance is connected to a gate of a MOS transistor and an FD. The advantage of not affecting the layout of the pixel portion is obtained when a coupling capacitance is connected to a gate of a MOS transistor and an FD included in a pixel. The MOS transistor is, for example, a reset transistor, a transfer transistor, or a select transistor.

According to the present embodiment, the voltage supplied to the gate of the reset transistor 6 is controlled so that VRESL1 is supplied at time T105 and T111. However, if the voltage supplied to the gate of the reset transistor 6 is lower than VRESL2, different voltages can be supplied to the gate of the reset transistor 6 at time T105 and T111. This is because the improvement in linearity can be obtained so long as, when the S and the N signals are output, the voltage of the gate of the reset transistor 6 is controlled at a voltage lower than the voltage that is used when the charge transfer is performed.

As is with the present embodiment, if voltages of the same value are supplied to the gate of the reset transistor 6 at time T105 and T111, a difference in reference voltages of the S and the N signals does not occur. Thus, a sensor output with small offset can be obtained when the difference processing of the S and the N signals is performed.

Figure 10:
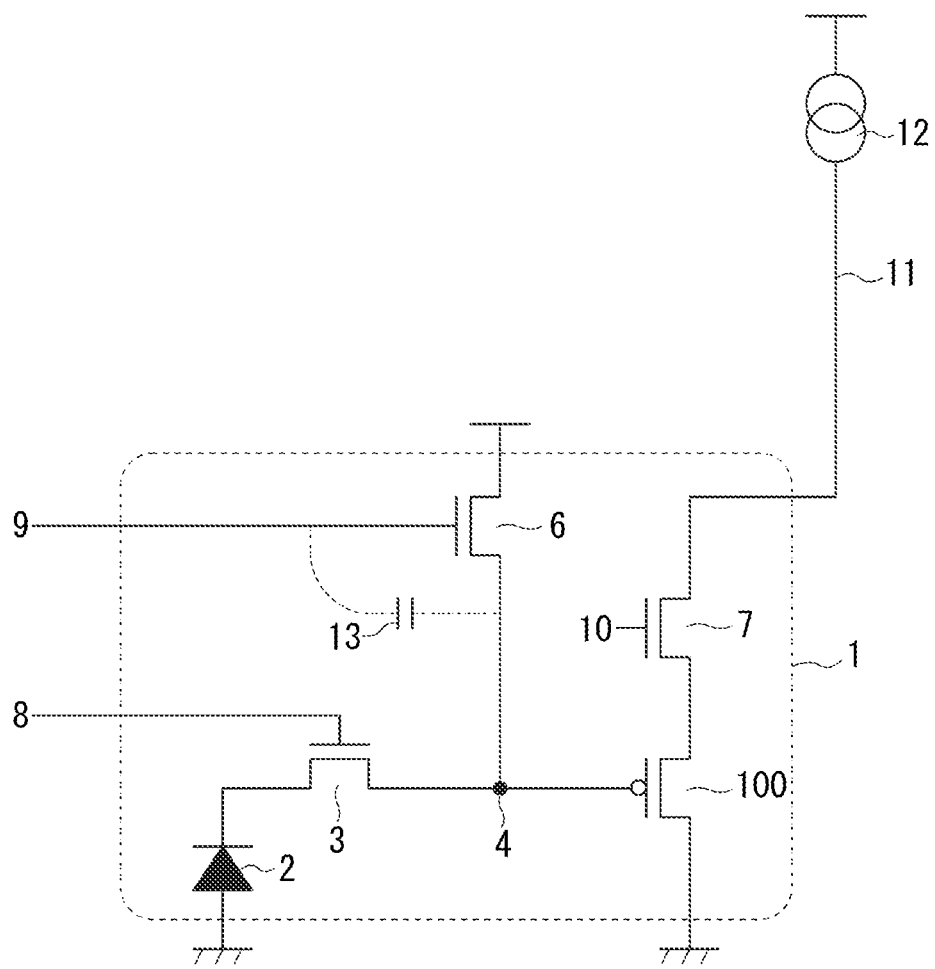
FIG. 10 illustrates the equivalent circuit of a pixel according to an alternate version of the first exemplary embodiment.

If the signal charge is carried by an electron, a p-channel amplifying transistor can be used. FIG. 10 is an equivalent circuit diagram of a pixel according to an alternate version of the first exemplary embodiment. In FIG. 10, components similar to those illustrated in FIG. 1 are denoted by the same reference numerals and detailed descriptions are not repeated.

According to the alternate version of the first exemplary embodiment, a p-channel amplifying transistor 100 is a MOS transistor. A drain of the p-channel amplifying transistor 100 is connected to a node that supplies a ground (GND) voltage. A source of the p-channel amplifying transistor 100 is connected to the vertical output line 11 via the select transistor 7. The constant current source 12 is connected to the vertical output line 11. A source follower circuit is configured by the p-channel amplifying transistor 100 and the constant current source 12.

According to such a configuration, since the voltage of the vertical output line 11 is increased when the voltage of the FD 4 is increased, the voltages of both ends of the constant current source 12 will be decreased. Thus, the transistor that is included in the constant current source 12 can operate more easily in the linear region. If the transistor in the constant current source 12 operates in the linear region, since the value of the current that flows through the vertical output line 11 is changed, the linearity of the output signal deteriorates.

Further, when the signal charge is carried by a hole, an effect similar to the first exemplary embodiment is obtained if a p-channel transistor is used as the amplifying transistor.

Figure 5:
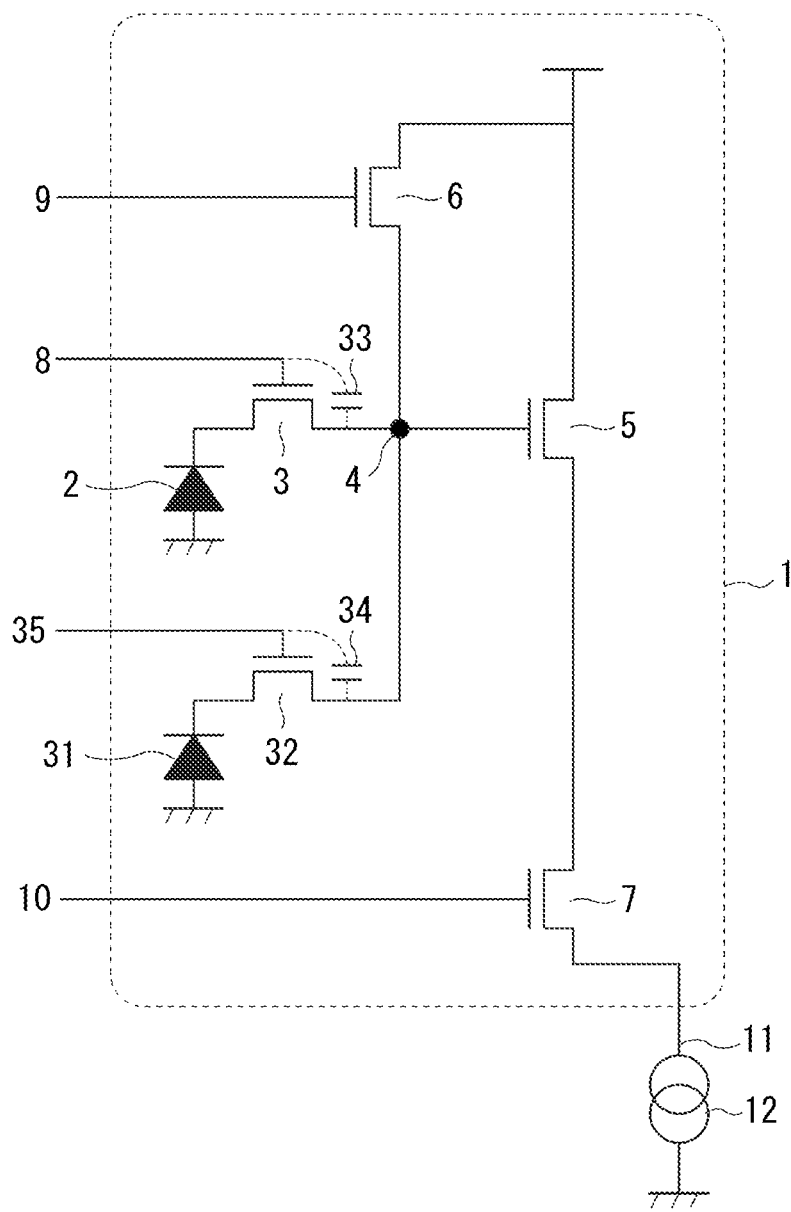
FIG. 5 is an equivalent circuit diagram of a pixel according to a second exemplary embodiment of the present invention.

FIG. 5 illustrates an equivalent circuit of a pixel according to a second exemplary embodiment of the present invention. Components similar to those in the first exemplary embodiment are denoted by the same reference numerals and their descriptions are not repeated.

According to the present embodiment, the PD 2 and a PD 31 are connected to one FD 4 via the transfer transistor 3 and a transfer transistor 32. Two pixels share one FD 4 and one amplifying transistor 5. According to the above-described configuration, the signal charge of two pixels can be added and read out. Further, the signal charge accumulated to each PD can be independently read out. Although one FD 4 is illustrated in FIG. 5, a case where one semiconductor region is provided for each pixel, and the semiconductor regions are electrically connected so as to form one node of the FD 4 is also considered as sharing of the FD 4.

A capacitor 33 is a coupling capacitance provided between the gate of the transfer transistor 3 and the FD 4. A capacitor 34 is a coupling capacitance provided between a gate of the transfer transistor 32 and the FD 4. Although not shown in FIG. 5, a coupling capacitance can also be provided between the control line 9 and the FD 4 according to the present embodiment.

According to the present embodiment, the voltage supplied to a control line connected to a gate of a transfer transistor which is not transferring the charge can be controlled. To be more specific, when one transfer transistor is turned on, the voltage supplied to the gate of the other transfer transistor is controlled so that it is higher than the voltage supplied to the other transfer transistor when the amplifying transistor 5 outputs a signal.

Figure 6:
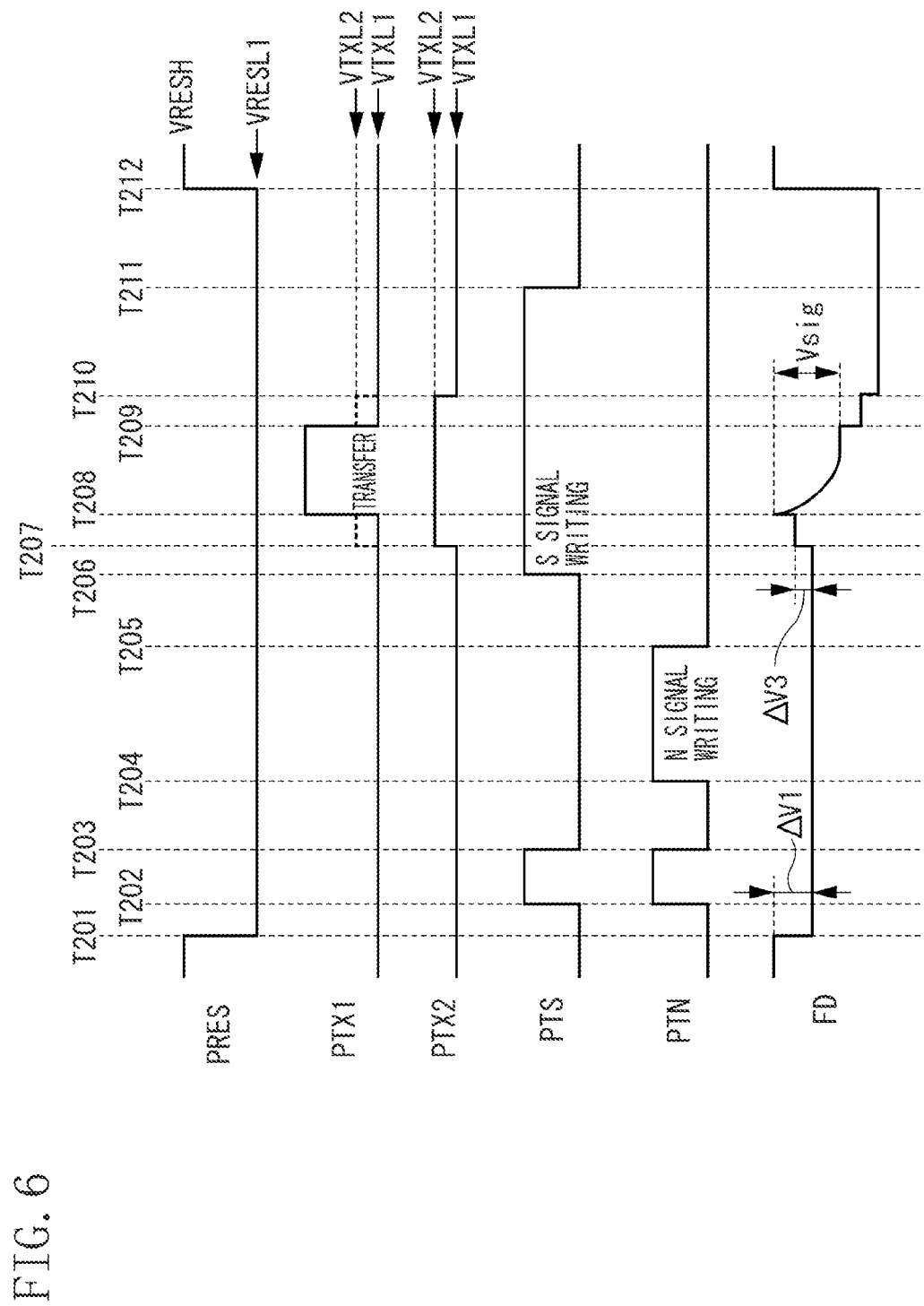
FIG. 6 illustrates drive pulses for driving the solid-state imaging device according to the second exemplary embodiment.

FIG. 6 illustrates drive pulses used for driving the solid-state imaging device according to the present embodiment. The drive for transferring the signal charge of the PD 2 to the FD 4 by the transfer transistor 3 will be described with reference to FIG. 6. In FIG. 6, PRES, PTS, PTN, and FD denote the drive pulses and the FD similar to those illustrated in FIG. 3. PTX1 denotes a drive pulse supplied to the gate of the transfer transistor 3 via the control line 8, and PTX2 denotes a drive pulse supplied to the gate of the transfer transistor 32 via a control line 35. When the voltage of the drive pulse is at the high level, the corresponding transistor is turned on. When the voltage of the drive pulse is at the low level, the corresponding transistor is turned off.

According to the present embodiment, two different voltages VTXL1 and VTXL2 can be set as the low level voltages of PTX1 and PTX2. VTXL2 is higher than VTXL1. The transfer transistors 3 and 32 are turned off by both VTXL1 and VTXL2. In other words, the transfer transistor 3 is turned on when PTX1 is VTXH (high level voltage) and turned off when PTX1 is VTXL1 or VTXL2 (low level voltage). The transfer transistor 32 is turned on when PTX2 is VTXH being the high level voltage and turned off when PTX2 is VTXL1 or VTXL2 (low level voltage).

In FIG. 6, the drive between time T201 and T206 and between time T211 and T212 is similar to the drive in the time between T101 and T106 and between T111 and T112 illustrated in FIG. 3 according to the first exemplary embodiment.

At time T207, the voltage of PTX2 is changed from VTXL1 to VTXL2. According to the change in the voltage of the gate of the transfer transistor 32, the voltage of the FD 4 is increased by ΔV3 via the capacitor 34. Even if the voltage of PTX2 is increased from VTXL1 to VTXL2, the transfer transistor 32 is not turned on.

At time T208, PTX1 is changed to the high level and the transfer transistor 3 is turned on. At this point in time, the transfer of the signal charge of the PD 2 to the FD 4 is started. At time T209, PTX1 is changed to the low level. Then, the transfer transistor 3 is turned off and the transfer of the signal charge ends. After the signal charge is transferred to the FD 4, the S signal, which is the signal that is output when the signal charge is transferred to the FD 4, is output to the vertical output line 11.

At time T210, when the voltage of PTX2 is changed from VTXL2 to VTXL1, the voltage of the FD 4 is decreased by ΔV3. PTX1 can be either VTXL1 or VTXL2 during the time between T207 and T208 and between T209 and T210.

According to the present embodiment, VTXL1 is supplied to the gate of the transfer transistor 32 at time T205 and T211 and VTXL2 is supplied to the gate of the transfer transistor 32 between time T207 and T210. The voltage of the FD 4 at time T207 is expressed as Vrs−ΔV1+ΔV3. The voltage of the FD 4 at time T205 and T211 is expressed as VRESH−Vth_res−ΔV1.

The condition for the complete transfer of the signal charge according to the present embodiment is expressed by replacing ΔV2 of equation (5) with ΔV3. According to the present embodiment, by appropriately setting ΔV1 and ΔV3, both equations (5) and (6) can be satisfied. Thus, according to the present embodiment, even if the voltage of the FD 4 is increased when the signal charge is transferred so that the maximum amount of charge that can be transferred is increased, good linearity of the sensor output can be obtained.

Further, a negative value can be set for VTXL1 so that the dark current at a channel portion of the transfer transistor can be reduced. By temporarily increasing the voltage of the gate of the transfer transistor 32 to VTXL2, noise due to dark current may occur. Thus, it is desirable to keep the period during which the voltage of the gate of the transfer transistor 32 is controlled to VTXL2 short. Further, from the viewpoint of reducing the dark current, a negative value can be set for VTXL2 if the relation of VTXL2>VTXL1 is satisfied.

Further, according to the present embodiment, the FD 4 can be shared by three of more pixels. For example, if one FD and one amplifying transistor are shared by four pixels, voltages of the gates of three transfer transistors other than the transfer transistor which is turned on for the charge transfer can be controlled. Compared to a case where only one transfer transistor is used, the amount of voltage change (ΔV3) of the FD 4 will be increased to approximately three times. Thus, according to the configuration of the present embodiment, in addition to the effect obtained from the first exemplary embodiment, the maximum amount of charge that can be transferred can be furthermore increased.

Figure 7:
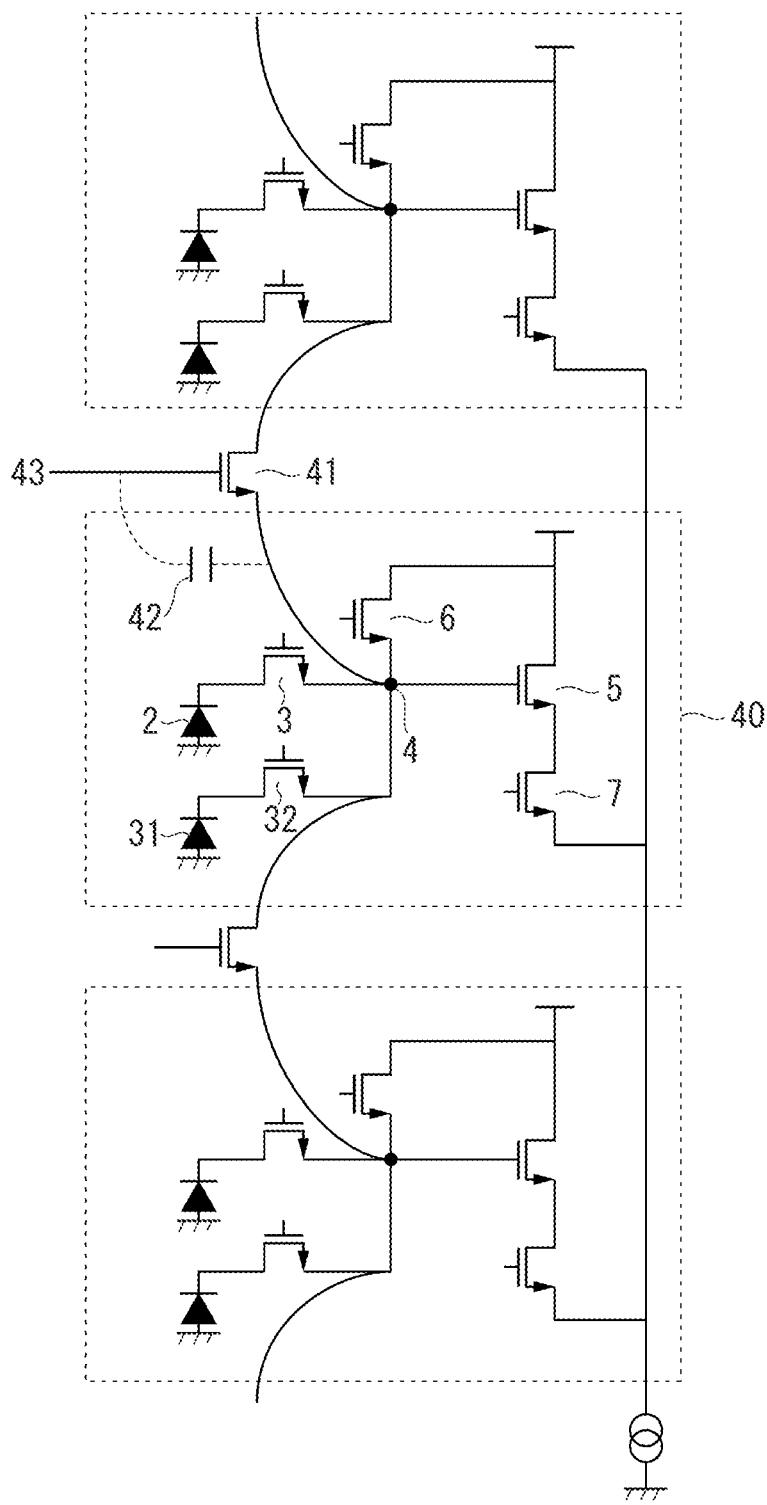
FIG. 7 is an equivalent circuit diagram of a pixel according to a third exemplary embodiment of the present invention.

FIG. 7 illustrates an equivalent circuit of a pixel according to a third exemplary embodiment of the present invention. Components similar to those in the first or the second exemplary embodiment are denoted by the same reference numerals and their descriptions are not repeated.

FIG. 7 illustrates a configuration where three pieces of block 40 of two pixels share one FD 4 and one amplifying transistor 5 arranged in the column direction. According to the present embodiment, one FD 4 in a block is connected to another FD 4 in an adjacent block via a connecting transistor 41. The connecting transistor 41 controls the electric connection of FDs in the adjacent blocks. According to this connecting transistor 41, signals of the adjacent blocks can be added. A capacitor 42 is a coupling capacitance provided between a gate of the connecting transistor 41 and the FD 4. A control line 43 is connected to the gate of the connecting transistor 41. Although not illustrated, a coupling capacitance can be additionally provided between the FD 4 and the control line of each transistor.

FIG. 7 illustrates a plurality of pixels included in one pixel column. Actually, since a plurality of columns of pixels of one column illustrated in FIG. 7 are arranged in the row direction, a pixel region of pixels arranged in a matrix is formed.

Figure 8:
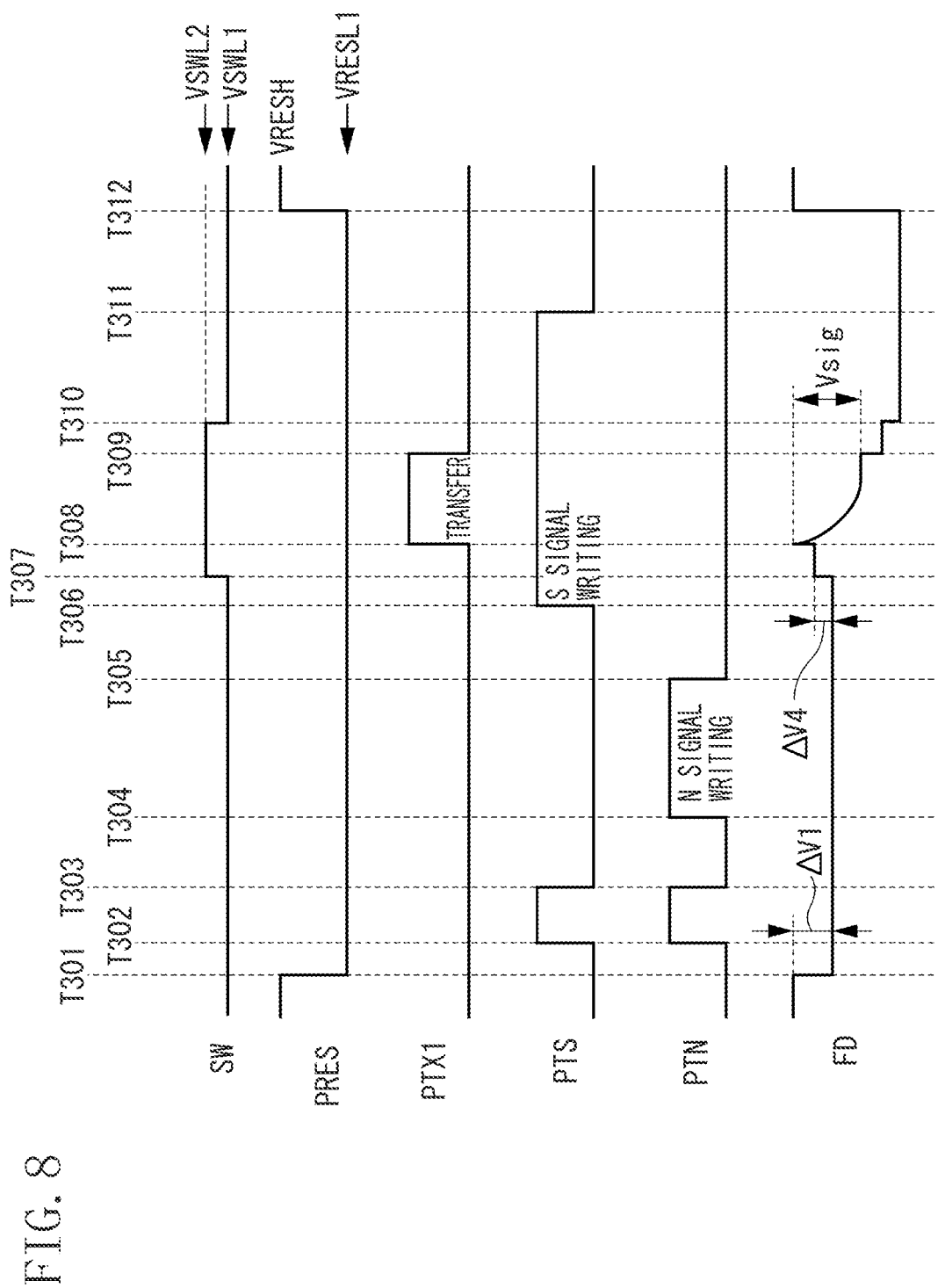
FIG. 8 illustrates drive pulses used for driving the solid-state imaging device according to the third exemplary embodiment.

FIG. 8 illustrates drive pulses used for driving the solid-state imaging device according to the present embodiment. The drive of the present embodiment will be described with reference to FIG. 8. In the description below, the drive for separately outputting signals for each block without adding the signals will be described. In other words, the connecting transistor 41 is continuously turned off during the period illustrated in FIG. 8.

In FIG. 8, PRES, PTX1, PTS, PTN, and FD denote the drive pulses and the FD similar to those illustrated in FIG. 6. Although the drive pulse PTX2 supplied to the gate of the transfer transistor 32 is not illustrated in FIG. 8, a pulse similar to the drive pulse PTX2 illustrated in FIG. 6 is supplied to the gate of the transfer transistor 32. A constant voltage can be continuously supplied to the gate of the transfer transistor 32 during the period illustrated in FIG. 8. SW denotes a drive pulse supplied to the gate of the connecting transistor 41 via the control line 43. When the voltage of the drive pulse is at the high level, the corresponding transistor is turned on. When the voltage of the drive pulse is at the low level, the corresponding transistor is turned off.

According to the present embodiment, two different voltages VSWL1 and VSW2 can be set as the low level voltages of the SW. VSWL2 denotes a voltage higher than VSWL1. Both VSWL1 and VSWL2 are voltages that can turn off the connecting transistor 41. In other words, the connecting transistor 41 is turned on when the voltage of SW is VSWH (high level voltage) and turned off when the voltage of SW is VSWL1 or VSWL2 (low level voltage).

In FIG. 8, the drive between time T301 and T306 and between time T311 and T312 is similar to the drive in the time between T101 and T106 and between T111 and T112 illustrated in FIG. 3 according to the first exemplary embodiment.

At time T307, the voltage of SW is changed from VSWL1 to VSWL2. According to the change in the voltage of the gate of the connecting transistor 41, the voltage of the FD 4 is increased by ΔV4 via the capacitor 42. Even if the voltage of SW is increased from VSWL1 to VSWL2, the connecting transistor 41 is not turned on.

At time T308, PTX1 is changed to the high level and the transfer transistor 3 is turned on. At this point in time, the transfer of the signal charge of the PD 2 to the FD 4 is started. At time T309, PTX1 is changed to the low level. Then, the transfer transistor 3 is turned off and the transfer of the signal charge ends.

At time T310, when the low level voltage of SW is decreased from VSWL2 to VSWL1, the FD voltage is decreased by ΔV4.

According to the present embodiment, VSWL1 is supplied to the gate of the transfer transistor 32 at time T305 and T311, and VSWL2 is supplied to the gate of the connecting transistor 41 between time T307 and T310. The voltage of the FD 4 at time T307 is expressed as Vrs−ΔV1+ΔV4. The voltage of the FD 4 at time T305 and T311 is expressed as VRESH−Vth_res−ΔV1.

The condition for the complete transfer of the signal charge according to the present embodiment is expressed by replacing ΔV2 of equation (5) with ΔV4. According to the present embodiment, by appropriately setting ΔV1 and ΔV4, both equations (5) and (6) can be satisfied. Thus, according to the present embodiment, as is with the above-described embodiments, even if the voltage of the FD 4 is increased when the signal charge is transferred so that the maximum amount of charge that can be transferred is increased, good linearity of the sensor output can be obtained.

It is described above that the connecting transistor 41 is continuously turned off during the period illustrated in FIG. 8 and addition of signals between blocks is not performed. The voltage of the gate of the connecting transistor 41 can be controlled while the connecting transistor 41 is turned on so that the signals can be added between blocks.

Figure 9:
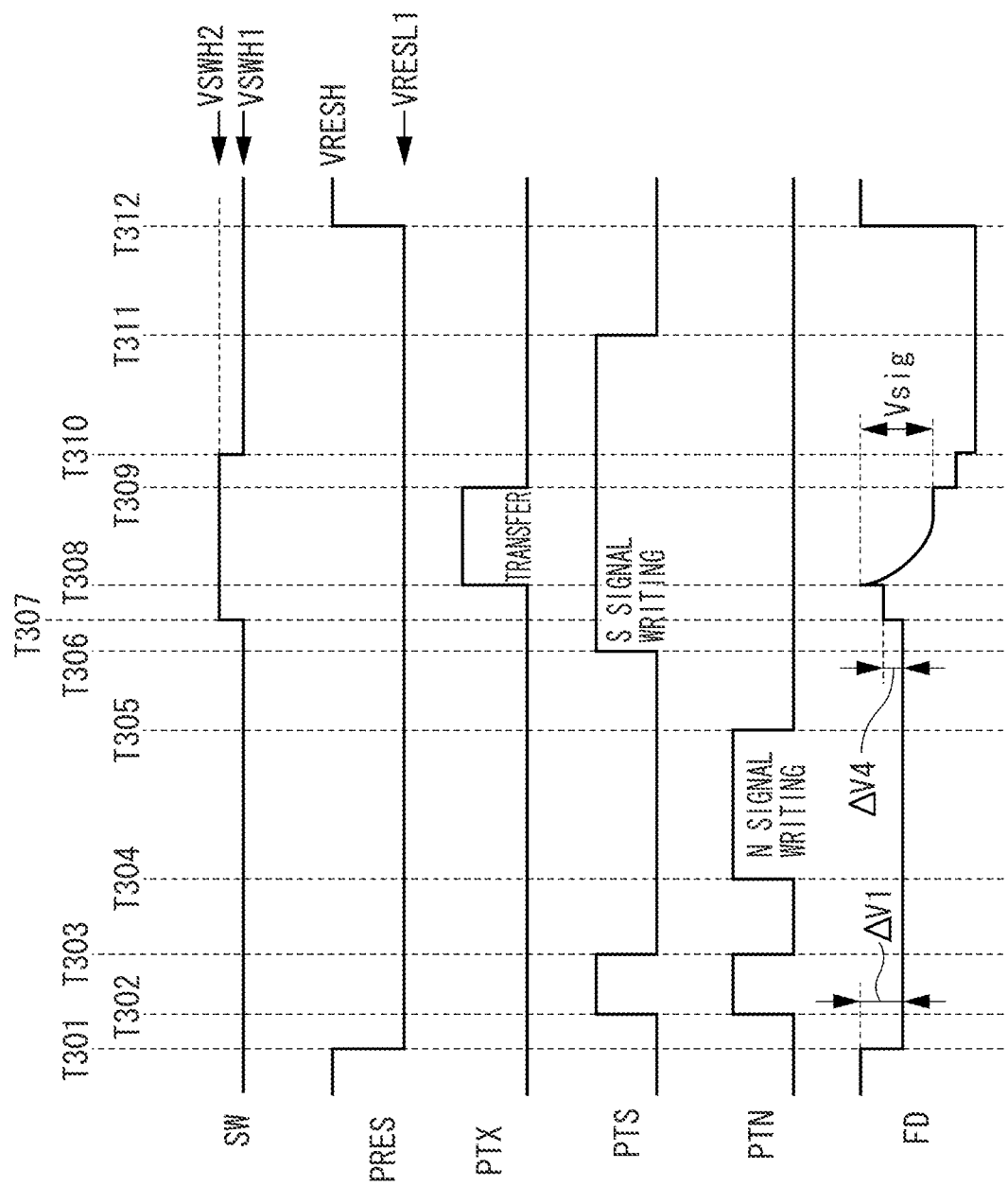
FIG. 9 illustrates drive pulses used for driving the solid-state imaging device according to the third exemplary embodiment.

FIG. 9 illustrates different drive pulses used for driving the solid-state imaging device according to the present embodiment. The connecting transistor 41 is continuously turned on during the period illustrated in FIG. 9. In FIG. 9, PRES, PTS, PTN, and FD denote the drive pulses and the FD similar to those illustrated in FIG. 8. PTX denotes a drive pulse supplied to a gate of a transfer transistor of a block adjacent to and connected to the transfer transistors 3 and 32 and the connecting transistor 41. SW denotes a drive pulse supplied to the gate of the connecting transistor 41 via the control line 43. When the voltage of the drive pulse is at the high level, the corresponding transistor is turned on. When the voltage of the drive pulse is at the low level, the corresponding transistor is turned off.

Two different voltages VSWH1 and VSWH2 are set as the high-level voltages of SW. VSWH2 is higher than VSWH1. Both VSWH1 and VSWH2 are voltages that turn on the connecting transistor 41.

The drive by the drive pulse illustrated in FIG. 9 is similar to the drive by the drive pulse illustrated in FIG. 8 except that the connecting transistor 41 is turned on. When the charge is being transferred (T308 to T309), VSWH2 is supplied to the gate of the connecting transistor 41. When the S signal and the N signal are output, VSWH1 is supplied to the gate of the connecting transistor 41. Thus, an effect similar to the case illustrated in FIG. 8 is obtained.

Although exemplary embodiments of the present invention have been described above, the configurations of the embodiments can be changed and combined so long as they are within the scope of the present invention. For example, the node that controls the voltage can be a node connected to the drain of the amplifying transistor. Since the drain and the gate of the amplifying transistor are coupled via a gate capacitor, the voltage of the FD can be changed by controlling the voltage of the drain.

According to the first to the third exemplary embodiments, although the transistors included in a pixel are n-channel MOS transistors, any of the transistors can be a p-channel MOS. For example, the reset transistor 6 can be a p-channel MOS when other transistors are n-channel transistors.

Further, according to the first to the third exemplary embodiments, the signal charge is an electron and an n-channel transistor is used as the amplifying transistor. However, the signal charge can be a hole and a p-channel transistor can be used as the amplifying transistor. In this case, the polarity of the voltage to be applied is reversed.

Further, according to the first and the second exemplary embodiments, VRESL2 and VTXL2 are voltages that turn off each transistor. However, VRESL2 and VTXL2 can be voltages that turn on each transistor if the period they are applied to is short enough. Similarly, VRESL2 and VTXL2 can be voltages of the sub-threshold region. Further, VRESL2, VTXL2, VSWL2, and VSWH2 can be intermittently supplied during the period the transfer transistor is turned on.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures, and functions.

This application claims priority from Japanese Patent Application No. 2010-144221 filed Jun. 24, 2010, which is hereby incorporated by reference herein in its entirety.

What is claimed is:

1. A solid-state imaging device comprising:
 a first photoelectric conversion portion;
 a floating diffusion node;
 a first transfer transistor configured to transfer an electron generated at the first photoelectric conversion portion to the floating diffusion node;
 an amplifying transistor configured to output a signal based on an amount of charge of the floating diffusion node;
 a voltage-controlled node; and
 a voltage control portion configured to control a voltage of the voltage-controlled node,
 wherein the amplifying transistor is configured to output a first signal in a first state where a voltage of the floating diffusion node is reset, wherein the amplifying transistor is further configured to output a second signal in a second state where the electron is transferred to the floating diffusion node,
wherein the voltage-controlled node is different from a node to which a voltage configured to set a conductive state of the first transfer transistor is supplied,
wherein the voltage-controlled node is coupled to the floating diffusion node via a coupling capacitance,
wherein the voltage control portion is configured to control the voltage of the voltage-controlled node so that:
the voltage of the voltage-controlled node is a first voltage when the amplifying transistor outputs the first signal before turning on of the first transfer transistor,
the voltage of the voltage-controlled node is a second voltage during at least a portion of a period from turning on of the first transfer transistor to turning off of the first transfer transistor, and
the voltage of the voltage-controlled node is a third voltage when the amplifying transistor outputs the second signal after turning off of the transfer transistor, and
wherein the second voltage is higher than each of the first voltage and the third voltage.

2. The solid-state imaging device according to claim 1, further comprising:
a reset transistor configured to reset the voltage of the floating diffusion node,
wherein one of a source and a drain of the reset transistor is connected to the floating diffusion node,
wherein a gate of the reset transistor is connected to the voltage-controlled node,
wherein the coupling capacitance includes a capacitance component between the gate of the reset transistor and the floating diffusion node, and
wherein each of the first voltage, the second voltage, and the third voltage is configured to set the reset transistor to a non-conductive state.

3. The solid-state imaging device according to claim 1, further comprising:
a second photoelectric conversion portion; and
a second transfer transistor configured to transfer signal charge generated at the second photoelectric conversion portion to the floating diffusion node,
wherein a gate of the second transfer transistor is connected to the voltage-controlled node,
wherein the coupling capacitance includes a capacitance component between the gate of the second transfer transistor and the floating diffusion node, and
wherein each of the first voltage, the second voltage, and the third voltage is configured to set the second transfer transistor to a non-conductive state.

4. The solid-state imaging device according to claim 1, further comprising:
a plurality of pixels, each including the first photoelectric conversion portion and the floating diffusion node; and
a connecting transistor configured to control electric connection between each of the floating diffusion nodes of two pixels out of the plurality of pixels,
wherein one of a source and a drain of the connecting transistor is connected to the floating diffusion node included in one or the other of the two pixels,
wherein a gate of the connecting transistor is connected to the voltage-controlled node, and
wherein the coupling capacitance includes a capacitance component between the gate of the connecting transistor and the floating diffusion node.

5. The solid-state imaging device according to claim 4, wherein each of the first voltage, the second voltage, and the third voltage is configured to set the connecting transistor to a non-conductive state.

6. The solid-state imaging device according to claim 4, wherein each of the first voltage, the second voltage, and the third voltage is configured to set the connecting transistor to a conductive state.

7. The solid-state imaging device according to claim 4, wherein each of the plurality of pixels further includes a second photoelectric conversion portion and a second transfer transistor configured to transfer signal charge generated at the second photoelectric conversion portion to the floating diffusion node.

8. The solid-state imaging device according to claim 7, wherein the amplifying transistor is a buried-channel type transistor.

9. The solid-state imaging device according to claim 1, wherein the amplifying transistor is a buried-channel type transistor.

10. The solid-state imaging device according to claim 1, wherein the first voltage and the third voltage are equal.

11. A solid-state imaging device comprising:
a first photoelectric conversion portion;
a floating diffusion node;
a first transfer transistor configured to transfer an electron generated at the first photoelectric conversion portion to the floating diffusion node;
an amplifying transistor configured to output a signal based on an amount of charge of the floating diffusion node;
a reset transistor configured to reset a voltage of the floating diffusion node; and
a voltage control portion configured to control a voltage of a gate of the reset transistor,
wherein the voltage control portion is configured to control the voltage of the gate of the reset transistor so that the voltage of the gate of the reset transistor is either a first voltage or a second voltage higher than the first voltage,
wherein the voltage control portion is further configured to control the voltage of the gate of the reset transistor so that the voltage of the gate of the reset transistor is the second voltage during at least a portion of a period from turning on of the first transfer transistor to turning off of the first transfer transistor, and
wherein each of the first voltage and the second voltage is configured to set the reset transistor to a non-conductive state.

12. The solid-state imaging device according to claim 11,
wherein the amplifying transistor is configured to output a first signal in a first state where the voltage of the floating diffusion node is reset;
wherein the amplifying transistor is configured to output a second signal in a second state where the electron is transferred to the floating diffusion node;
wherein the voltage control portion is further configured to control the voltage of the gate of the reset transistor to a third voltage; and
wherein the voltage control portion is further configured to control the voltage of the gate of the reset transistor so that the voltage of the gate of the reset transistor is the first voltage when the amplifying transistor outputs the first signal,
wherein the voltage control portion is further configured to control the voltage of the gate of the reset transistor so that the voltage of the gate of the reset transistor is the third voltage when the amplifying transistor outputs the second signal, wherein the second voltage is higher than the third voltage, and wherein the third voltage is configured to set the reset transistor to the non-conductive state.

13. The solid-state imaging device according to claim 11, wherein the voltage control portion is a circuit that includes a first MOS transistor having a first-conductivity type channel and a second MOS transistor having a second-conductivity type channel, wherein a gate of the first MOS transistor is connected to a gate of the second MOS transistor, wherein one of a source and a drain of the first MOS transistor is connected to a line that supplies a reference voltage, wherein the other of the source and the drain of the first MOS transistor is electrically connected to the gate of the reset transistor, wherein one of a source and a drain of the second MOS transistor is electrically connected to the gate of the reset transistor, and wherein the other of the source and the drain of the second MOS transistor is selectively connectable to a line that supplies the first voltage and to a line that supplies the second voltage.

14. A solid-state imaging device comprising:
a first photoelectric conversion portion;
a second photoelectric conversion portion;
a floating diffusion node;
a first transfer transistor configured to transfer an electron generated at the first photoelectric conversion portion to the floating diffusion node;
a second transfer transistor configured to transfer an electron generated at the second photoelectric conversion portion to the floating diffusion node;
an amplifying transistor configured to output a signal based on an amount of charge of the floating diffusion node; and
a voltage control portion configured to control a voltage of a gate of the second transfer transistor,
wherein the amplifying transistor is configured to output a first signal in a first state where a voltage of the floating diffusion node is reset,
wherein the amplifying transistor is further configured to output a second signal in a second state where the electron generated at the first photoelectric conversion portion is transferred to the floating diffusion node,
wherein the voltage control portion is configured to control the voltage of the gate of the second transfer transistor so that:
the voltage of the gate of the second transfer transistor is a first voltage when the amplifying transistor outputs the first signal,
the voltage of the gate of the second transfer transistor is a second voltage during at least a portion of a period in which the first transfer transistor is in a conductive state, and
the voltage of the gate of the second transfer transistor is a third voltage when the amplifying transistor outputs the second signal,
wherein the second voltage is higher than each of the first voltage and the third voltage, and
wherein each of the first voltage, the second voltage, and the third voltage is configured to set the second transfer transistor to a non-conductive state.

15. A solid-state imaging device comprising:
a first photoelectric conversion portion;
a floating diffusion node;
a first transfer transistor configured to transfer a hole generated at the first photoelectric conversion portion to the floating diffusion node;
an amplifying transistor configured to output a signal based on an amount of charge of the floating diffusion;
a voltage-controlled node; and
a voltage control portion configured to control a voltage of the voltage-controlled node,
wherein the amplifying transistor is configured to output a first signal in a first state where a voltage of the floating diffusion node is reset,
wherein the amplifying transistor is further configured to output a second signal in a second state where the hole is transferred to the floating diffusion node,
wherein the voltage-controlled node is different from a node to which a voltage configured to set a conductive state of the first transfer transistor is supplied,
wherein the voltage-controlled node is coupled to the floating diffusion node via a coupling capacitance,
wherein the voltage control portion is configured to control the voltage of the voltage-controlled node so that:
the voltage of the voltage-controlled node is a first voltage when the amplifying transistor outputs the first signal before turning on of the first transfer transistor,
the voltage of the voltage-controlled node is a second voltage during at least a portion of a period from turning on of the first transfer transistor to turning off of the first transfer transistor, and
the voltage of the voltage-controlled node is a third voltage when the amplifying transistor outputs the second signal after turning off of the transfer transistor, and
wherein the second voltage is lower than each of the first voltage and the third voltage.

16. The solid-state imaging device according to claim 15, further comprising:
a reset transistor configured to reset the voltage of the floating diffusion node,
wherein one of a source and a drain of the reset transistor is connected to the floating diffusion node,
wherein a gate of the reset transistor is connected to the voltage-controlled node,
wherein the coupling capacitance includes a capacitance component between the gate of the reset transistor and the floating diffusion node, and
wherein each of the first voltage, the second voltage, and the third voltage is configured to set the reset transistor to a non-conductive state.

17. The solid-state imaging device according to claim 15, further comprising:
a second photoelectric conversion portion; and
a second transfer transistor configured to transfer signal charge generated at the second photoelectric conversion portion to the floating diffusion node,
wherein a gate of the second transfer transistor is connected to the voltage-controlled node,
wherein the coupling capacitance includes a capacitance component between the gate of the second transfer transistor and the floating diffusion node, and
wherein each of the first voltage, the second voltage, and the third voltage is configured to set the second transfer transistor to a non-conductive state.

18. The solid-state imaging device according to claim 15, further comprising:
- a plurality of pixels, each including the first photoelectric conversion portion and the floating diffusion node, and
- a connecting transistor configured to control electric connection between each of the floating diffusion nodes of two pixels out of the plurality of pixels,
- wherein one of a source and a drain of the connecting transistor is connected to the floating diffusion node included in one or the other of the two pixels,
- wherein a gate of the connecting transistor is connected to the voltage-controlled node, and
- wherein the coupling capacitance includes a capacitance component between the gate of the connecting transistor and the floating diffusion node.

19. The solid-state imaging device according to claim 18, wherein each of the first voltage, the second voltage, and the third voltage is configured to set the connecting transistor to a non-conductive state.

20. The solid-state imaging device according to claim 18, wherein each of the first voltage, the second voltage, and the third voltage is configured to set the connecting transistor to a conductive state.

21. The solid-state imaging device according to claim 18, wherein each of the plurality of pixels further includes a second photoelectric conversion portion and a second transfer transistor configured to transfer signal charge generated at the second photoelectric conversion portion to the floating diffusion node.

22. The solid-state imaging device according to claim 21, wherein the amplifying transistor is a buried-channel type transistor.

23. The solid-state imaging device according to claim 15, wherein the amplifying transistor is a buried-channel type transistor.

24. The solid-state imaging device according to claim 15, wherein the first voltage and the third voltage are equal.

25. A solid-state imaging device comprising:
- a first photoelectric conversion portion;
- a floating diffusion node;
- a first transfer transistor configured to transfer a hole generated at the first photoelectric conversion portion to the floating diffusion node;
- an amplifying transistor configured to output a signal based on an amount of charge of the floating diffusion node;
- a reset transistor configured to reset a voltage of the floating diffusion node; and
- a voltage control portion configured to control a voltage of a gate of the reset transistor,
- wherein the voltage control portion is configured to control the voltage of the gate of the reset transistor so that the voltage of the gate of the reset transistor is either a first voltage or a second voltage lower than the first voltage,
- wherein the voltage control portion is further configured to control the voltage of the gate of the reset transistor so that the voltage of the gate of the reset transistor is the second voltage during at least a portion of a period from turning on of the first transfer transistor to turning off of the first transfer transistor, and
- wherein each of the first voltage and the second voltage is configured to set the reset transistor to a non-conductive state.

26. The solid-state imaging device according to claim 25, wherein the amplifying transistor is configured to output a first signal in a first state where the voltage of the floating diffusion node is reset;
- wherein the amplifying transistor is further configured to output a second signal in a second state where the hole is transferred to the floating diffusion node;
- wherein the voltage control portion is further configured to control the voltage of the gate of the reset transistor to a third voltage; and
- wherein the voltage control portion is further configured to controls the voltage of the gate of the reset transistor so that the voltage of the gate of the reset transistor is the first voltage when the amplifying transistor outputs the first signal,
- wherein the voltage control portion is further configured to control the voltage of the gate of the reset transistor so that the voltage of the gate of the reset transistor is the third voltage when the amplifying transistor outputs the second signal,
- wherein the second voltage is lower than the third voltage, and
- wherein the third voltage is configured to set the reset transistor to the non-conductive state.

27. The solid-state imaging device according to claim 25, wherein the voltage control portion is a circuit that includes a first MOS transistor having a first-conductivity type channel and a second MOS transistor having a second-conductivity type channel,
- wherein a gate of the first MOS transistor is connected to a gate of the second MOS transistor,
- wherein one of a source and a drain of the first MOS transistor is connected to a line that supplies a reference voltage,
- wherein the other of the source and the drain of the first MOS transistor is electrically connected to the gate of the reset transistor,
- wherein one of a source and a drain of the second MOS transistor is electrically connected to the gate of the reset transistor, and
- wherein the other of the source and the drain of the second MOS transistor is selectively connectable to a line that supplies the first voltage and to a line that supplies the second voltage.

28. A drive method for a solid-state imaging device,
the solid-state imaging device including:
- a photoelectric conversion portion;
- a floating diffusion node;
- an amplifying transistor configured to output a signal based on an amount of charge of the floating diffusion node;
- a transfer transistor configured to transfer an electron generated at the photoelectric conversion portion to the floating diffusion node; and
- a node coupled to the floating diffusion node via a coupling capacitance, the node being different from a node to which a voltage configured to set the transfer transistor to a conductive state is supplied, the method comprising:
- via the amplifying transistor, outputting a first signal in a first state where a voltage of the floating diffusion node is reset;
- via the amplifying transistor, outputting a second signal in a second state where the electron is transferred to the floating diffusion node;
- controlling a voltage of the node to a first voltage when the amplifying transistor outputs the first signal before turning on of the first transfer transistor;

controlling the voltage of the node to a second voltage during at least a portion of a period from turning on of the first transfer transistor to turning off of the first transfer transistor; and controlling the voltage of the node to a third voltage when the amplifying transistor outputs the second signal after turning off of the transfer transistor, wherein the second voltage is higher than each of the first voltage and the third voltage.

29. A drive method for a solid-state imaging device, the solid-state imaging device including:
    a photoelectric conversion portion;
    a floating diffusion node;
    an amplifying transistor configured to output a signal based on an amount of charge of the floating diffusion;
    a transfer transistor configured to transfer a hole generated at the photoelectric conversion portion to the floating diffusion; and
    a node coupled to the floating diffusion node via a coupling capacitance, the node being different from a node to which a voltage configured to set the transfer transistor to a conductive state is supplied, the method comprising:
    via the amplifying transistor, outputting a first signal in a first state where a voltage of the floating diffusion node is reset;
    via the amplifying transistor, outputting a second signal in a second state where the hole is transferred to the floating diffusion node;
    controlling a voltage of the node to a first voltage when the amplifying transistor outputs the first signal before turning on of the first transfer transistor;
    controlling the voltage of the node to a second voltage during at least a portion of a period from turning on of the first transfer transistor to turning off of the first transfer transistor; and
    controlling the voltage of the node to a third voltage when the amplifying transistor outputs the second signal after turning off of the transfer transistor, wherein the second voltage is lower than each of the first voltage and the third voltage.

* * * * *